United States Patent
Sato et al.

(10) Patent No.: US 11,124,894 B2
(45) Date of Patent: Sep. 21, 2021

(54) VAPOR PHASE GROWTH APPARATUS AND VAPOR PHASE GROWTH METHOD

(71) Applicant: NuFlare Technology, Inc., Yokohama (JP)

(72) Inventors: Yuusuke Sato, Bunkyo-ku (JP); Hideshi Takahashi, Yokohama (JP); Hideki Ito, Yokohama (JP); Takanori Hayano, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 45 days.

(21) Appl. No.: 16/453,223

(22) Filed: Jun. 26, 2019

(65) Prior Publication Data
US 2019/0316274 A1 Oct. 17, 2019

Related U.S. Application Data

(62) Division of application No. 15/244,235, filed on Aug. 23, 2016, now Pat. No. 10,385,474.

(30) Foreign Application Priority Data

Aug. 28, 2015 (JP) .................................. 2015-168860

(51) Int. Cl.
| | | |
|---|---|---|
| C30B 29/40 | (2006.01) | |
| C23C 16/52 | (2006.01) | |
| C23C 16/44 | (2006.01) | |
| C30B 25/10 | (2006.01) | |
| C30B 25/16 | (2006.01) | |
| C23C 16/455 | (2006.01) | |
| H01L 21/02 | (2006.01) | |

(52) U.S. Cl.
CPC ........ *C30B 29/406* (2013.01); *C23C 16/4412* (2013.01); *C23C 16/45561* (2013.01);
(Continued)

(58) Field of Classification Search
CPC combination set(s) only.
See application file for complete search history.

(56) References Cited

U.S. PATENT DOCUMENTS

| | | |
|---|---|---|
| 5,968,587 A | 10/1999 | Frankel |
| 2002/0142493 A1 | 10/2002 | Halliyal |

(Continued)

FOREIGN PATENT DOCUMENTS

| | | |
|---|---|---|
| DE | 10 2010 016 471 A1 | 10/2011 |
| JP | 01-296613 | 11/1989 |
| JP | 10-158843 | 6/1998 |
| JP | 2002-212735 | 7/2002 |

(Continued)

OTHER PUBLICATIONS

Office Action dated Jun. 27, 2019 in German Patent Application No. 10 2016 216 073.7, 8 pages (with English translation).

(Continued)

*Primary Examiner* — Erin F Bergner
(74) *Attorney, Agent, or Firm* — Oblon, McClelland, Maier & Neustadt, L.L.P.

(57) ABSTRACT

A vapor phase growth apparatus according to an embodiment includes, n reactors performing a deposition process for a plurality of substrates at the same time, a first main gas supply path distributing a predetermined amount of first process gas including a group-III element to the n reactors at the same time, a second main gas supply path distributing a predetermined amount of second process gas including a group-V element to the n reactors at the same time, a controller controlling a flow rate of the first and second process gas, on the basis of control values of the flow rates of the first and second process gas supplied to the n reactors, and independently controlling predetermined process parameter independently set for each of the n reactors on the basis of control values, rotary drivers, and a heater.

5 Claims, 7 Drawing Sheets

(52) U.S. Cl.
CPC .. *C23C 16/45565* (2013.01); *C23C 16/45574* (2013.01); *C23C 16/52* (2013.01); *C30B 25/10* (2013.01); *C30B 25/165* (2013.01); *C30B 29/403* (2013.01); *H01L 21/0254* (2013.01); *H01L 21/0262* (2013.01)

(56) References Cited

U.S. PATENT DOCUMENTS

| | | | |
|---|---|---|---|
| 2005/0011459 A1* | 1/2005 | Liu | C23C 16/45504 118/728 |
| 2013/0045548 A1 | 2/2013 | Kappeler et al. | |
| 2013/0104996 A1 | 5/2013 | Oh | |
| 2013/0171350 A1* | 7/2013 | Kraus | C23C 16/303 427/255.28 |
| 2016/0032488 A1 | 2/2016 | Takahashi et al. | |

FOREIGN PATENT DOCUMENTS

| | | |
|---|---|---|
| JP | 2003-49278 | 2/2003 |
| JP | 2007-242875 | 9/2007 |
| JP | 2013-526017 | 6/2013 |
| JP | 2016-33997 | 3/2016 |

OTHER PUBLICATIONS

Office Action dated Mar. 19, 2019, in Japanese Patent Application No. 2015-168860, filed Aug. 28, 2015, w/English-language Translation.

Office Action dated May 21, 2019, in Japanese Patent Application No. 2015-168860, filed Aug. 28, 2015, w/English-language Translation.

Office Action dated Aug. 18, 2020 in corresponding Japanese Patent Application No. 2019-153867 (with English Translation), 6 pages.

* cited by examiner

VAPOR PHASE GROWTH APPARATUS AND VAPOR PHASE GROWTH METHOD

CROSS-REFERENCE TO RELATED APPLICATION

This application is a continuation of U.S. application Ser. No. 15/244,235 filed Aug. 23, 2016, and is based upon and claims the benefit of priority from Japanese Patent Applications No. 2015-168860, filed on Aug. 28, 2015, the entire contents of each of which are incorporated herein by reference.

FIELD OF THE INVENTION

The present invention relates to a vapor phase growth apparatus and a vapor phase growth method that supply gas to form a film.

BACKGROUND OF THE INVENTION

As a method for forming a high-quality semiconductor film, there is an epitaxial growth technique which grows a single-crystal film on a substrate, such as a wafer, using vapor phase growth. In a vapor phase growth apparatus using the epitaxial growth technique, a wafer is placed on a support portion in a reactor which is maintained at normal pressure or reduced pressure. Then, process gas, such as source gas which will be a raw material for forming a film, is supplied from an upper part of the reactor to the surface of the wafer in the reactor while the wafer is being heated. For example, the thermal reaction of the source gas occurs in the surface of the wafer and an epitaxial single-crystal film is formed on the surface of the wafer.

In recent years, as a material forming a light emitting device or a power device, a gallium nitride (GaN)-based semiconductor device has drawn attention. Metal organic chemical vapor deposition (MOCVD) method is an epitaxial growth technique that can forma GaN-based semiconductor film. In the organic metal vapor phase growth method, organic metal, such as trimethylgallium (TMG), trimethylindium (TMI), or trimethylaluminum (TMA), or ammonia ($NH_3$) is used as the source gas.

JP H10-158843A and JP 2002-212735A disclose a vapor phase growth apparatus that includes a plurality of reactors in order to improve productivity. In addition, JP 2003-49278A discloses a method that changes the pressure control value of a reactor caused a trouble when films are grown in a plurality of reactors.

SUMMARY OF THE INVENTION

According to an aspect of the invention, there is provided a vapor phase growth apparatus including: n (n is an integer equal to or greater than 2) reactors performing a deposition process for a plurality of substrates at the same time; a first main gas supply path distributing a predetermined amount of first process gas including a group-III element and supplying the first process gas to the n reactors at the same time; a second main gas supply path distributing a predetermined amount of second process gas including a group-V element and supplying the second process gas to the n reactors at the same time; a controller controlling a flow rate of the first process gas and a flow rate of the second process gas, on the basis of control values of flow rates of the first process gas and the second process gas supplied to the n reactors, the controller independently controlling at least one predetermined process parameter in the n reactors, on the basis of control values of the at least one predetermined process parameter independently set for each of the n reactors; a rotary driver provided in each of the n reactors and rotating each of the plurality of substrates; and a heater provided in each of the n reactors and heating each of the plurality of substrates.

According to another aspect of the invention, there is provided a vapor phase growth method including: loading a plurality of substrates to n reactors; distributing a predetermined amount of first process gas including a group-III element and starting the first process gas supply to the n reactors at the same time at a flow rate controlled on the basis of control values of a first flow rate; distributing a predetermined amount of second process gas including a group-V element and starting second process gas supply to the n reactors at the same time at a flow rate controlled on the basis of control values of a second flow rate; controlling independently at least one predetermined process parameter of the n reactors, on the basis of control values of the at least one predetermined process parameter, and growing films on the plurality of substrates in the n reactors at the same time; shutting off the first process gas supply to the n reactors at the same time; and shutting off the second process gas to the n reactors at the same time.

DETAILED DESCRIPTION OF THE EMBODIMENTS

Figure 1:
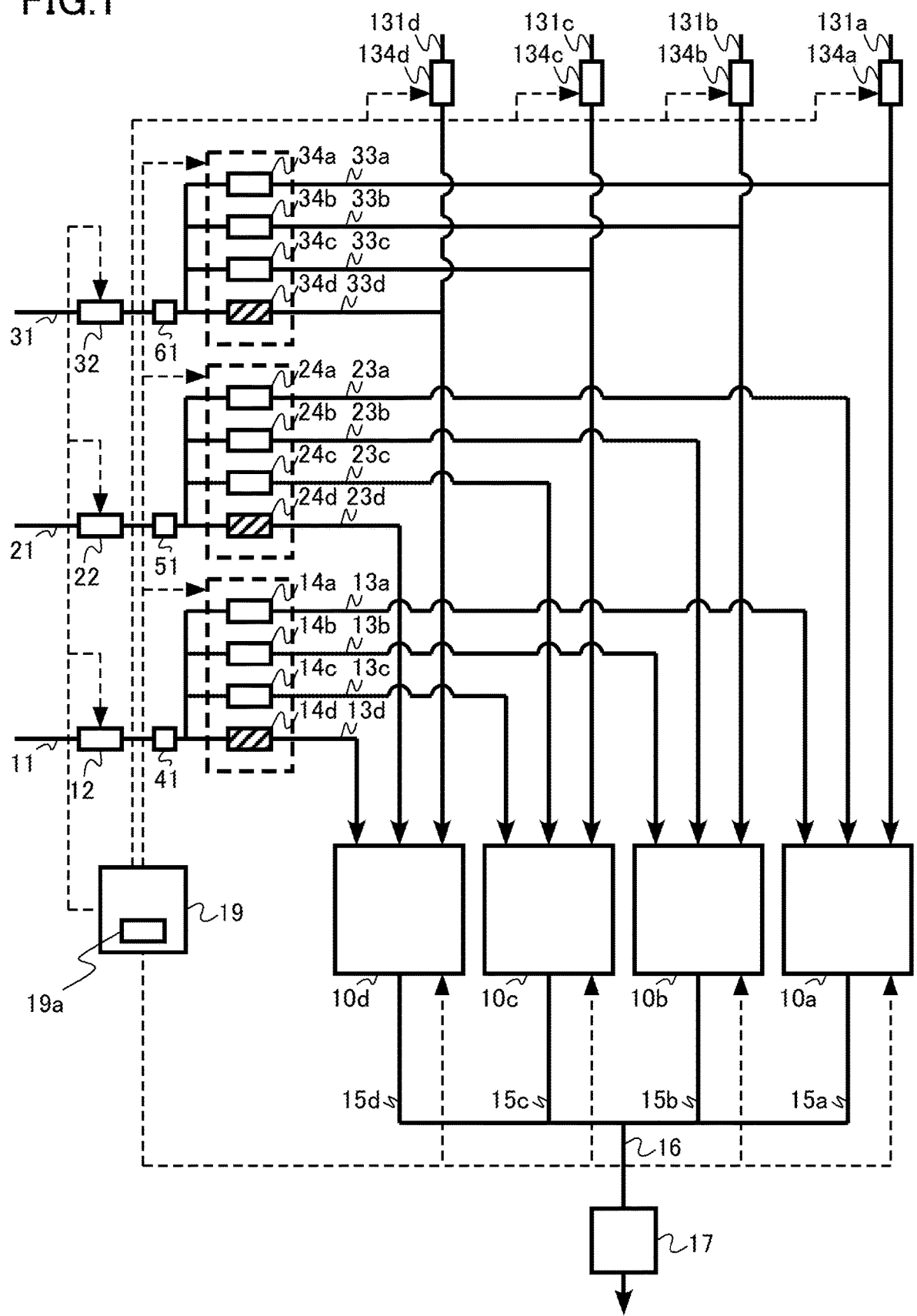
FIG. 1 is a diagram illustrating the structure of a vapor phase growth apparatus according to a first embodiment.

Hereinafter, embodiments of the invention will be described with reference to the drawings.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference. Furthermore, a "longitudinal direction" is the direction of gravity.

In the specification, "process gas" is a general term of gas used to form a film on a substrate. The concept of the "process gas" includes, for example, source gas, carrier gas, and diluent gas.

First Embodiment

A vapor phase growth apparatus according to this embodiment includes, n (n is an integer equal to or greater than 2) reactors performing a deposition process for a plurality of substrates at the same time, a first main gas supply path distributing a predetermined amount of first process gas including a group-III element and supplying the first process gas to the n reactors at the same time, a second main gas supply path distributing a predetermined amount of second process gas including a group-V element and supplying the second process gas to the n reactors at the same time, a controller controlling a flow rate of the first process gas and a flow rate of the second process gas, on the basis of control values of the flow rates of the first process gas and the second process gas supplied to the n reactors, and independently controlling predetermined process parameters that are independently set for each of the n reactors, on the basis of control values of the predetermined process parameters, rotary drivers provided in each of the n reactors and rotating each of the plurality of substrates, and heaters provided in each of the n reactors and heating the plurality of substrates.

A vapor phase growth method according to this embodiment includes, loading a plurality of substrates to n reactors, distributing a predetermined amount of first process gas including a group-III element and starting the first process gas supply to the n reactors at a flow rate that is controlled on the basis of a control value of a first flow rate at the same time, distributing a predetermined amount of second process gas including a group-V element and starting the second process gas supply to the n reactors at a flow rate that is controlled on the basis of a control value of a second flow rate at the same time, independently controlling predetermined process parameters of the n reactors, on the basis of control values of the predetermined process parameters of the n reactors, and growing films on the plurality of substrates in the n reactors at the same time, shutting off the first process gas supply to the n reactors at the same time, and shutting off the second process gas supply to the n reactors at the same time.

According to the vapor phase growth apparatus and the vapor phase growth method having the above-mentioned structure according to this embodiment, when films are formed on substrates in a plurality of reactors at the same time, it is possible to adjust the characteristics of the films grown in each reactor. The characteristics of the film are, for example, the thickness or composition of the film.

FIG. 1 is a diagram illustrating the structure of the vapor phase growth apparatus according to this embodiment. The vapor phase growth apparatus according to this embodiment is an epitaxial growth apparatus using a metal organic chemical vapor deposition (MOCVD) method.

The vapor phase growth apparatus according to this embodiment includes four reactors 10a, 10b, 10c, and 10d. Each of the four reactors 10a, 10b, 10c, and 10d is, for example, a vertical single-wafer-type epitaxial growth apparatus. The number of reactors is not limited to 4 and two or more reactors may be used. The number of reactors can be represented by n (n is an integer equal to or greater than 2).

The vapor phase growth apparatus according to this embodiment includes a first main gas supply path 11, a second main gas supply path 21, and a third main gas supply path 31 which supply process gas to the four reactors 10a, 10b, 10c, and 10d.

The first main gas supply path 11 supplies, for example, a first process gas including organic metal, which is a group III element, and carrier gas to the reactors 10a, 10b, 10c, and 10d. The first process gas is gas including a group-III element when a group III-V semiconductor film is formed on a wafer. The first main gas supply path 11 distributes and supplies a predetermined amount of first process gas including a group-III element to the four reactors 10a, 10b, 10c, and 10d at the same time.

The group-III element is, for example, gallium (Ga), aluminum (Al), or indium (In). In addition, the organic metal is, for example, trimethylgallium (TMG), trimethylaluminum (TMA), or trimethylindium (TMI).

The carrier gas is, for example, hydrogen gas. Only the hydrogen gas may flow through the first main gas supply path 11.

A first main mass flow controller 12 is provided in the first main gas supply path 11. The first main mass flow controller 12 controls the flow rate of the first process gas that flows through the first main gas supply path 11.

In addition, the first main gas supply path 11 is branched into three first sub-gas supply paths 13a, 13b, and 13c and one second sub-gas supply path 13d at a position that is closer to the reactors 10a, 10b, 10c, and 10d than to the first main mass flow controller 12. The first sub-gas supply paths 13a, 13b, and 13c and the second sub-gas supply path 13d supply the distributed first process gases to the four reactors 10a, 10b, 10c, and 10d, respectively.

A first manometer 41 is provided in the first main gas supply path 11. The first manometer 41 is provided between the first main mass flow controller 12 and the position where the first main gas supply path 11 is branched into the three first sub-gas supply paths 13a, 13b, and 13c and the one second sub-gas supply path 13d. The first manometer 41 monitors the pressure of the first main gas supply path 11.

First sub-mass flow controllers 14a, 14b, and 14c are provided in the three first sub-gas supply paths 13a, 13b, and 13c, respectively. The first sub-mass flow controllers 14a, 14b, and 14c control the flow rate of the first process gas that flows through the first sub-gas supply paths 13a, 13b, and 13c, respectively. The first sub-mass flow controllers 14a, 14b, and 14c are a flow rate control type.

A fourth sub-mass flow controller 14d of an opening position control type is provided in the one second sub-gas supply path 13d. The second sub-gas supply path 13d supplies the first process gas to one reactor 10d other than three reactors 10a, 10b, and 10c to which the first sub-gas supply paths 13a, 13b, and 13c supply the first process gas, respectively. In the total amount of first process gas supplied from the first main gas supply path 11, the remainder of the first process gas which does not flow through the first sub-gas supply paths 13a, 13b, and 13c flows from the second sub-gas supply path 13d to the reactor 10d.

Specifically, the degree of opening of the fourth sub-mass flow controller 14d is controlled on the basis of the measurement result of the pressure of the first main gas supply path 11 monitored by the first manometer 41. For example, the degree of opening of the fourth sub-mass flow controller 14d is controlled such that the pressure monitored by the first manometer 41 is zero. According to this structure, in the total amount of first process gas supplied from the first main gas supply path 11, the remainder of the first process gas which does not flow through the first sub-gas supply paths 13a, 13b, and 13c can flow from the second sub-gas supply path 13d to the reactor 10d.

For example, the second main gas supply path 21 supplies a second process gas including ammonia ($NH_3$) to the reactors 10a, 10b, 10c, and 10d. The second process gas is a source gas of a group-V element and nitrogen (N) when a group III-V semiconductor film is formed on a wafer. The second main gas supply path 21 distributes and supplies a predetermined amount of second process gas including a group-V element to the four reactors 10a, 10b, 10c, and 10d at the same time.

Only hydrogen gas may flow through the second main gas supply path 21.

A second main mass flow controller 22 is provided in the second main gas supply path 21. The second main mass flow controller 22 controls the flow rate of the second process gas that flows through the second main gas supply path 21.

In addition, the second main gas supply path 21 is branched into three third sub-gas supply paths 23a, 23b, and 23c and one fourth sub-gas supply path 23d at a position that is closer to the reactors 10a, 10b, 10c, and 10d than to the second main mass flow controller 22. The third sub-gas supply paths 23a, 23b, and 23c and the fourth sub-gas supply path 23d supply the distributed second process gases to the four reactors 10a, 10b, 10c, and 10d, respectively.

A second manometer 51 is provided in the second main gas supply path 21. The second manometer 51 is provided between the second main mass flow controller 22 and the position where the second main gas supply path 21 is branched into the three third sub-gas supply paths 23a, 23b, and 23c and the one fourth sub-gas supply path 23d. The second manometer 51 monitors the pressure of the second main gas supply path 21.

Second sub-mass flow controllers 24a, 24b, and 24c are provided in the three third sub-gas supply paths 23a, 23b, and 23c, respectively. The second sub-mass flow controllers 24a, 24b, and 24c control the flow rate of the second process gas that flows through the third sub-gas supply paths 23a, 23b, and 23c, respectively. The second sub-mass flow controllers 24a, 24b, and 24c are a flow rate control type.

A fifth sub-mass flow controller 24d of an opening position control type is provided in the one fourth sub-gas supply path 23d. The fourth sub-gas supply path 23d supplies the second process gas to one reactor 10d other than three reactors 10a, 10b, and 10c to which the third sub-gas supply paths 23a, 23b, and 23c supply the second process gas, respectively. In the total amount of second process gas supplied from the second main gas supply path 21, the remainder of the second process gas which does not flow through the third sub-gas supply paths 23a, 23b, and 23c flows from the fourth sub-gas supply path 23d to the reactor 10d.

Specifically, the degree of opening of the fifth sub-mass flow controller 24d is controlled on the basis of the measurement result of the pressure of the second main gas supply path 21 monitored by the second manometer 51. For example, the degree of opening of the fifth sub-mass flow controller 24d is controlled such that the pressure monitored by the second manometer 51 is zero. According to this structure, in the total amount of second process gas supplied from the second main gas supply path 21, the remainder of the second process gas which does not flow through the third sub-gas supply paths 23a, 23b, and 23c can flow from the fourth sub-gas supply path 23d to the reactor 10d.

The third main gas supply path 31 supplies a diluent gas which dilutes the first process gas and the second process gas to the reactors 10a, 10b, 10c, and 10d. The first process gas and the second process gas are diluted with the diluent gas to adjust the concentration of the group-III element and the group-V element supplied to the reactors 10a, 10b, 10c, and 10d. The diluent gas is inert gas, such as hydrogen gas, nitrogen gas, or argon gas, or a mixed gas thereof.

A third main mass flow controller 32 is provided in the third main gas supply path 31. The third main mass flow controller 32 controls the flow rate of the diluent gas that flows through the third main gas supply path 31.

In addition, the third main gas supply path 31 is branched into three fifth sub-gas supply paths (diluent gas supply lines) 33a, 33b, and 33c and one sixth sub-gas supply path (diluent gas supply line) 33d at a position that is closer to the reactors 10a, 10b, 10c, and 10d than to the third main mass flow controller 32. The fifth sub-gas supply paths 33a, 33b, and 33c and the sixth sub-gas supply path 33d supply the distributed diluent gases to the four reactors 10a, 10b, 10c, and 10d, respectively. The three fifth sub-gas supply paths and the one sixth sub-gas supply path are an example of four diluent gas supply lines.

A third manometer 61 is provided in the third main gas supply path 31. The third manometer 61 is provided between the third main mass flow controller 32 and the position where the third main mass flow controller 32 is branched into the three fifth sub-gas supply paths 33a, 33b, and 33c and the one sixth sub-gas supply path 33d. The third manometer 61 monitors the pressure of the third main gas supply path 31.

Third sub-mass flow controllers 34a, 34b, and 34c are provided in the three fifth sub-gas supply paths 33a, 33b, and 33c, respectively. The third sub-mass flow controllers 34a, 34b, and 34c control the flow rate of the diluent gas that flows through the fifth sub-gas supply paths 33a, 33b, and 33c, respectively. The third sub-mass flow controllers 34a, 34b, and 34c are a flow rate control type.

A sixth sub-mass flow controller 34d of an opening position control type is provided in the one sixth sub-gas supply path 33d. The sixth sub-gas supply path 33d supplies the diluent gas to one reactor 10d other than three reactors 10a, 10b, and 10c to which the fifth sub-gas supply paths 33a, 33b, and 33c supply the diluent gas, respectively. In the total amount of diluent gas supplied from the third main gas supply path 31, the remainder of the diluent gas which does not flow through the fifth sub-gas supply paths 33a, 33b, and 33c flows from the sixth sub-gas supply path 33d to the reactor 10d.

Specifically, the degree of opening of the sixth sub-mass flow controller 34d is controlled on the basis of the measurement result of the pressure of the third main gas supply path 31 monitored by the third manometer 61. For example, the degree of opening of the sixth sub-mass flow controller 34d is controlled such that the pressure monitored by the third manometer 61 is zero. According to this structure, in the total amount of diluent gas supplied from the third main gas supply path 31, the remainder of the diluent gas which does not flow through the fifth sub-gas supply paths 33a, 33b, and 33c can flow from the sixth sub-gas supply path 33d to the reactor 10d.

Four adjustment gas supply paths 131a, 131b, 131c, and 131d are connected to the fifth sub-gas supply paths 33a, 33b, and 33c and the sixth sub-gas supply path 33d, respectively. The adjustment gas supply paths 131a, 131b, 131c, and 131d are connected to the fifth sub-gas supply paths 33a, 33b, and 33c and the sixth sub-gas supply path 33d at the positions that are closer to the reactors 10a, 10b, 10c, and 10d than to the third sub-mass flow controllers 34a, 34b, and 34c and the sixth sub-mass flow controller 34d, respectively.

The adjustment gas supply paths 131a, 131b, 131c, and 131d supply the diluent gas to the fifth sub-gas supply paths 33a, 33b, and 33c and the sixth sub-gas supply path 33d, respectively. Inert gas, such as hydrogen gas, nitrogen gas, or argon gas, is supplied to the adjustment gas supply paths 131a, 131b, 131c, and 131d.

Adjustment mass flow meters 134a, 134b, 134c, and 134d are provided in the adjustment gas supply paths 131a, 131b, 131c, and 131d, respectively. The adjustment mass flow meters 134a, 134b, 134c, and 134d adjust the amount of diluent gas supplied to the fifth sub-gas supply paths 33a, 33b, and 33c and the sixth sub-gas supply path 33d, respectively. The adjustment mass flow meters 134a, 134b, 134c, and 134d are, for example, a flow rate control type.

The adjustment gas supply paths 131a, 131b, 131c, and 131d independently adjust the flow rate of the diluent gas supplied to the reactors 10a, 10b, 10c, and 10d. The concentration of the group-III element and the group-V element in the process gas supplied to the reactors can be independently adjusted by the adjustment gas supply paths 131a, 131b, 131c, and 131d.

The vapor phase growth apparatus according to this embodiment includes four sub-gas exhaust paths 15a, 15b, 15c, and 15d through which gas is discharged from the four reactors 10a, 10b, 10c, and 10d. In addition, the vapor phase growth apparatus includes a main gas exhaust path 16 that is connected to the four sub-gas exhaust paths 15a, 15b, 15c, and 15d. A vacuum pump 17 for drawing gas is provided in the main gas exhaust path 16. The vacuum pump 17 is an example of a pump.

In addition, the vapor phase growth apparatus according to this embodiment includes a controller 19. The controller 19 controls the flow rate of the first process gas and the flow rate of the second process gas, on the basis of the control values of the flow rates of the first process gas and the second process gas supplied to the four reactors 10a, 10b, 10c, and 10d. Furthermore, the controller 19 independently controls predetermined process parameters which are independently set for the four reactors 10a, 10b, 10c, and 10d, on the basis of the control values of the predetermined process parameters.

The controller 19 can control the control values of the process parameters of the four reactors 10a, 10b, 10c, and 10d under the same conditions, that is, in the same process recipe, at the same time. In addition, the controller 19 performs control such that four operations, that is, a first process gas supply start operation, a first process gas supply shut off operation, a second process gas supply start operation, and a second process gas supply shut off operation are performed in the four reactors 10a, 10b, 10c, and 10d at the same time.

The controller 19 can perform control such that the control values of the predetermined process parameters of the four reactors 10a, 10b, 10c, and 10d are independently set for the four reactors 10a, 10b, 10c, and 10d and films are grown on the substrates at the same time in the four reactors 10a, 10b, 10c, and 10d, in order to match the characteristics of the films formed in the four reactors 10a, 10b, 10c, and 10d.

The predetermined process parameters which can be independently set are at least one of the control values of the concentration of the group-III element and the group-V element supplied to the reactors, the rotation speed of the substrate, the temperature of the substrate, and an output from a heater.

The controller 19 includes a calculator 19a. The calculator 19a has a function of calculating the control values of the predetermined process parameters from information about the correlation between the characteristics of the films obtained in advance in the four reactors 10a, 10b, 10c, and 10d and the predetermined process parameters and the characteristics of the films obtained in advance in the four reactors 10a, 10b, 10c, and 10d.

The controller 19 is, for example, a controller. The controller is, for example, hardware or a combination of hardware and software.

The controller 19 controls the amount of diluent gas supplied, on the basis of, for example, the control value of the concentration of the group-III element and the group-V element independently set for each of the four reactors 10a, 10b, 10c, and 10d.

Figure 2:
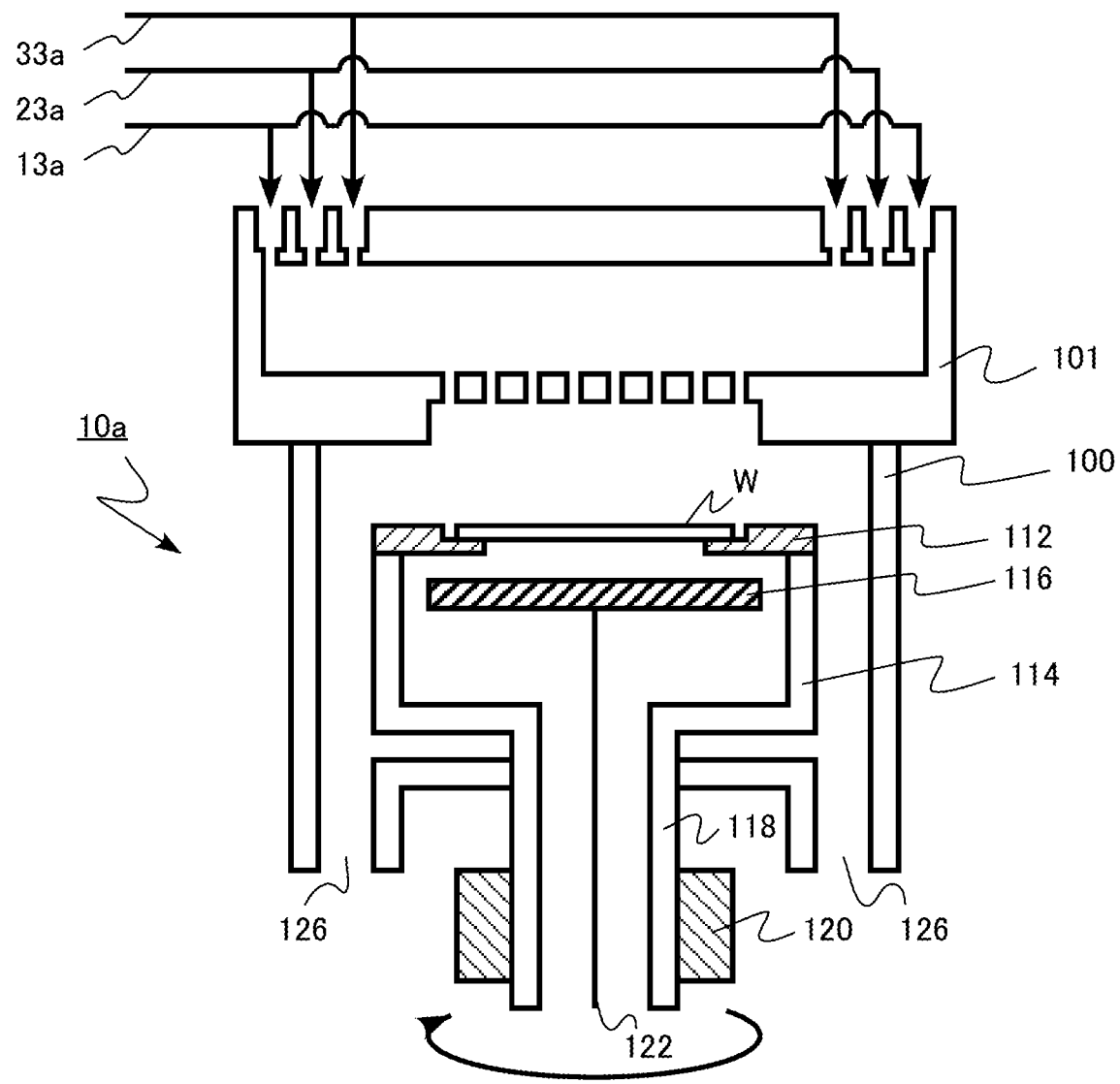
FIG. 2 is a cross-sectional view schematically illustrating a reactor of the vapor phase growth apparatus according to the first embodiment.

FIG. 2 is a cross-sectional view schematically illustrating the reactor of the vapor phase growth apparatus according to this embodiment. FIG. 2 illustrates one of the four reactors 10a, 10b, 10c, and 10d, for example, the reactor 10a. The four reactors 10a, 10b, 10c, and 10d have the same structure.

As illustrated in FIG. 2, the reactor 10a according to this embodiment includes, for example, a wall surface 100 of a stainless cylindrical hollow body. A shower plate 101 is provided in an upper part of the reactor 10a. The shower plate 101 supplies the process gas into the reactor 10a.

The reactor 10a includes a support portion 112. A semiconductor wafer (substrate) W can be placed on the support portion 112. The support portion 112 is, for example, an annular holder that has an opening formed at the center thereof or a susceptor without an opening.

The first sub-gas supply path 13a, the third sub-gas supply path 23a, and the fifth sub-gas supply path 33a are connected to the shower plate 101. A plurality of gas ejection holes for ejecting the first process gas, the second process gas, and the diluent gas which are mixed in the shower plate 101 into the reactor 10a are provided in the surface of the shower plate 101 close to the reactor 10a.

The reactor 10a includes a rotary driver 114. The support portion 112 is provided above the rotary driver 114. In the rotary driver 114, a rotating shaft 118 is connected to a rotary driver 120. The rotary driver 120 can rotate the semiconductor wafer W placed on the support portion 112 at a speed that is, for example, equal to or greater than 50 rpm and equal to or less than 3000 rpm. The rotary driver 120 is, for example, a motor.

The rotary driver 114 includes a heater 116 that heats the wafer W placed on the support portion 112. The heater 116 is, for example, a heater.

The heater 116 is provided in the rotary driver 114 so as to be fixed. Power is supplied to the heater 116 through an electrode 122 that passes through the rotating shaft 118 to control the output of the heater 116 from 0% to 100%. In addition, a push up pin (not illustrated) that passes through the heater 116 is provided in order to attach or detach the semiconductor wafer W to or from the support portion 112.

A gas discharge portion 126 is provided at the bottom of the reactor 10a. The gas discharge portion 126 discharges a reaction product obtained by the reaction of source gas on the surface of the semiconductor wafer W and the process gas remaining in the reactor 10a to the outside of the reactor 10a. The gas discharge portion 126 is connected to the sub-gas exhaust path 15a (FIG. 1).

A wafer inlet and a gate valve (not illustrated) are provided in the wall surface 100 of the reactor 10a. The semiconductor wafer W can be loaded to or unloaded from the reactor 10a by the wafer inlet and the gate valve.

A vapor phase growth method according to this embodiment uses the epitaxial growth apparatus illustrated in FIGS. 1 and 2. Next, the vapor phase growth method according to this embodiment will be described. An example in which a stacked film obtained by stacking a plurality of first nitride semiconductor films including indium (In) and gallium (Ga) and a plurality of second nitride semiconductor films including gallium (Ga) is formed on a GaN film will be described.

The first nitride semiconductor film and the second nitride semiconductor film are single-crystal films which are formed by epitaxial growth. The stacked film is, for example, a multi-quantum well (MQW) layer of a light emitting diode (LED).

In the vapor phase growth method according to this embodiment, first, a variation in the characteristics of a film which is formed on a substrate for a test (test substrate) in each of the reactors 10a, 10b, 10c, and 10d is evaluated. The characteristics of the film are the thickness and composition of the film. When a film is grown on the test substrate, the controller 19 controls the process parameters of the four reactors 10a, 10b, 10c, and 10d with the same initial control value.

First, a semiconductor wafer W2, which is an example of the test substrate, is loaded to each of the four reactors 10a, 10b, 10c, and 10d. GaN films are formed on a plurality of semiconductor wafers W2 in advance.

An indium gallium nitride (InGaN) film and a gallium nitride (GaN) film are alternately grown on the GaN film of the semiconductor wafer W2. When the InGaN film is formed, a mixed gas (first process gas) of TMG and TMI having, for example, nitrogen gas as carrier gas is supplied from the first main gas supply path 11 to each of the four reactors 10a, 10b, 10c, and 10d. In addition, for example, ammonia (second process gas) is supplied from the second main gas supply path 21 to each of the four reactors 10a, 10b, 10c, and 10d.

When the GaN film is formed on the semiconductor wafer W2, TMG (first process gas) having, for example, nitrogen gas as carrier gas is supplied from the first main gas supply path 11 to each of the four reactors 10a, 10b, 10c, and 10d. In addition, for example, ammonia (second process gas) is supplied from the second main gas supply path 21 to each of the four reactors 10a, 10b, 10c, and 10d.

The first process gas, of which the flow rate has been controlled by the first main mass flow controller 12, flows to the first main gas supply path 11. The first process gas is distributed and flows to the three first sub-gas supply paths 13a, 13b, and 13c and the one second sub-gas supply path 13d which are branched from the first main gas supply path 11.

The flow rates of the first process gases distributed to the three first sub-gas supply paths 13a, 13b, and 13c are controlled by the first sub-mass flow controllers 14a, 14b, and 14c, respectively. For example, the flow rates of the first process gases controlled by the first sub-mass flow controllers 14a, 14b, and 14c are set such that a quarter (¼) of the total amount of first process gas set by the first main mass flow controller 12 flows.

In addition, the degree of opening of the fourth sub-mass flow controller 14d is controlled such that the pressure of the first main gas supply path 11 monitored by the first manometer 41 is zero. In this way, the remainder of the first process gas which does not flow through the three first sub-gas supply paths 13a, 13b, and 13c, that is, the amount of first process gas which corresponds to a quarter (¼) of the total amount of first process gas flows to the remaining one second sub-gas supply path 13d. The first process gases distributed from the first main gas supply path 11 to the three first sub-gas supply paths 13a, 13b, and 13c and the second sub-gas supply path 13d are supplied to the four reactors 10a, 10b, 10c, and 10d, respectively.

A predetermined amount of first process gas is distributed and the supply of the first process gas to each of the four reactors 10a, 10b, 10c, and 10d at a flow rate that is controlled on the basis of the control value of a first flow rate starts at the same time.

The second process gas, of which the flow rate has been controlled by the second main mass flow controller 22, flows to the second main gas supply path 21. Then, the second process gas is distributed and flows to three third sub-gas supply paths 23a, 23b, and 23c and one fourth sub-gas supply path 23d which are branched from the second main gas supply path 21.

The flow rates of the second process gases distributed to the three third sub-gas supply paths 23a, 23b, and 23c are controlled by the second sub-mass flow controllers 24a, 24b, and 24c, respectively. For example, the flow rates of the second process gases controlled by the second sub-mass flow controllers 24a, 24b, and 24c are set such that a quarter (¼) of the total amount of second process gas set by the second main mass flow controller 22 flows.

In addition, the degree of opening of the fifth sub-mass flow controller 24d is controlled such that the pressure of the second main gas supply path 21 monitored by the second manometer 51 is zero. In this way, the remainder of the second process gas which does not flow through the three third sub-gas supply paths 23a, 23b, and 23c, that is, the amount of second process gas which corresponds to a quarter (¼) of the total amount of second process gas flows to the remaining one fourth sub-gas supply path 23d. The second process gases distributed from the second main gas supply path 21 to the three third sub-gas supply paths 23a, 23b, and 23c and the fourth sub-gas supply path 23d are supplied to the four reactors 10a, 10b, 10c, and 10d, respectively.

A predetermined amount of second process gas is distributed and the supply of the second process gas to each of the four reactors 10a, 10b, 10c, and 10d at a flow rate that is controlled on the basis of the control value of a second flow rate starts at the same time.

When an InGaN film and a GaN film are alternately grown on the GaN film of the semiconductor wafer W2, the controller 19 performs control such that four operations, that is, the first process gas supply start operation, the first process gas supply shut off operation, the second process gas supply start operation, and the second process gas supply shut off operation are performed in the four reactors 10a, 10b, 10c, and 10d at the same time.

When an InGaN film and a GaN film are alternately grown on the GaN film of the semiconductor wafer W2, the diluent gas is supplied from the third main gas supply path 31 to the four reactors 10a, 10b, 10c, and 10d on the basis of the same initial control value.

When an InGaN film and a GaN film are alternately grown on the GaN film of the semiconductor wafer W2, the initial control values of three process parameters, that is, the concentration of the group-III element and the group-V element supplied to the four reactors 10a, 10b, 10c, and 10d, the rotation speed of the semiconductor wafer W2, and the temperature of the semiconductor wafer W2 are set to the same value for the four reactors 10a, 10b, 10c, and 10d and films are grown on a plurality of semiconductor wafers W2 in the four reactors 10a, 10b, 10c, and 10d at the same time.

The control value of the concentration of the group-III element and the group-V element supplied to the four reactors 10a, 10b, 10c, and 10d is, for example, the flow rate control values of the first main mass flow controller 12 and the second main mass flow controller 22. The control value of the rotation speed of the semiconductor wafer W2 is the rotation number control value of the rotary driver 114. The control value of the temperature of the semiconductor wafer W2 is, for example, the control value of power supplied to the heater 116.

The first process gas, the second process gas, and the diluent gas are supplied to each of the reactors 10a, 10b, 10c, and 10d by the above-mentioned method and a stacked film obtained by alternately stacking the InGaN film and the GaN film is formed on the semiconductor wafer W2.

Then, the semiconductor wafers W2 are unloaded from the four reactors 10a, 10b, 10c, and 10d and the characteristics of the films grown on the semiconductor wafer W2 are measured. The characteristics of the film are, for example, the thickness and composition of the film. For example, the thickness of the film can be measured on an image captured by a transmission electron microscope (TEM). The composition of the film can be measured by, for example, a secondary ion mass spectrometry (SIMS).

In the subsequent process, when the same stacked film is grown, the control values of the process parameters to be set are determined on the basis of the characteristics of the films grown on the test semiconductor wafer W2. The process parameters are the concentration of the group-III element and the group-V element supplied to the four reactors 10a, 10b, 10c, and 10d, the rotation speed of the semiconductor wafer W2, and the temperature of the semiconductor wafer W2.

For example, the calculator 19a of the controller 19 calculates the control values of the concentration of the group-III element and the group-V element, the rotation speed of the semiconductor wafer W2, and the temperature of the semiconductor wafer W2 from information about the correlation among the thickness and composition of the film obtained in advance in each of the four reactors 10a, 10b, 10c, and 10d, the concentration of the group-III element and the group-V element, the rotation speed of the semiconductor wafer W2, and the temperature of the semiconductor wafer W2 and the thickness and composition of the film obtained from the semiconductor wafer W2.

The control values of the process parameters which are set for each of the reactors 10a, 10b, 10c, and 10d are set such that the films grown in the reactors 10a, 10b, 10c, and 10d have the same thickness and composition.

Then, a semiconductor wafer W1 which is an example of the substrate is loaded to each of the four reactors 10a, 10b, 10c, and 10d. A GaN film is formed on the semiconductor wafer W1 in advance.

An InGaN film and a GaN film are alternately grown on the GaN film of the semiconductor wafer W1. When the InGaN film is formed, a mixed gas (first process gas) of TMG and TMI having, for example, nitrogen gas as carrier gas is supplied from the first main gas supply path 11 to each of the four reactors 10a, 10b, 10c, and 10d. In addition, for example, ammonia (second process gas) is supplied from the second main gas supply path 21 to each of the four reactors 10a, 10b, 10c, and 10d.

When the GaN film is formed on the semiconductor wafer W1, TMG (first process gas) having, for example, nitrogen gas as carrier gas is supplied from the first main gas supply path 11 to each of the four reactors 10a, 10b, 10c, and 10d. In addition, for example, ammonia (second process gas) is supplied from the second main gas supply path 21 to each of the four reactors 10a, 10b, 10c, and 10d.

The first process gas, of which the flow rate has been controlled by the first main mass flow controller 12, flows to the first main gas supply path 11. The first process gas is distributed and flows to three first sub-gas supply paths 13a, 13b, and 13c and one second sub-gas supply path 13d which are branched from the first main gas supply path 11.

The flow rates of the first process gases distributed to the three first sub-gas supply paths 13a, 13b, and 13c are controlled by the first sub-mass flow controllers 14a, 14b, and 14c, respectively. For example, the flow rates of the first process gases controlled by the first sub-mass flow controllers 14a, 14b, and 14c are set such that a quarter (¼) of the total amount of first process gas set by the first main mass flow controller 12 flows.

In addition, the degree of opening of the fourth sub-mass flow controller 14d is controlled such that the pressure of the first main gas supply path 11 monitored by the first manometer 41 is zero. In this way, the remainder of the first process gas which does not flow through the three first sub-gas supply paths 13a, 13b, and 13c, that is, the amount of first process gas which corresponds to a quarter (¼) of the total amount of first process gas flows to the remaining one second sub-gas supply path 13d. The first process gases distributed from the first main gas supply path 11 to the three first sub-gas supply paths 13a, 13b, and 13c and the second sub-gas supply path 13d are supplied to the four reactors 10a, 10b, 10c, and 10d, respectively.

A predetermined amount of first process gas is distributed and the supply of the first process gas to each of the four reactors 10a, 10b, 10c, and 10d at a flow rate that is controlled on the basis of the control value of a first flow rate starts at the same time.

The second process gas, of which the flow rate has been controlled by the second main mass flow controller 22, flows to the second main gas supply path 21. Then, the second process gas is distributed and flows to the three third sub-gas supply paths 23a, 23b, and 23c and the one fourth sub-gas supply path 23d which are branched from the second main gas supply path 21.

The flow rates of the second process gases distributed to the three third sub-gas supply paths 23a, 23b, and 23c are controlled by the second sub-mass flow controllers 24a, 24b, and 24c, respectively. For example, the flow rates of the second process gases controlled by the second sub-mass flow controllers 24a, 24b, and 24c are set such that a quarter (¼) of the total amount of second process gas set by the second main mass flow controller 22 flows.

In addition, the degree of opening of the fifth sub-mass flow controller 24d is controlled such that the pressure of the second main gas supply path 21 monitored by the second manometer 51 is zero. In this way, the remainder of the second process gas which does not flow through the three third sub-gas supply paths 23a, 23b, and 23c, that is, the amount of second process gas which corresponds to a quarter (¼) of the total amount of second process gas flows to the remaining one fourth sub-gas supply path 23d. The second process gases distributed from the second main gas supply path 21 to the three third sub-gas supply paths 23a, 23b, and 23c and the fourth sub-gas supply path 23d are supplied to the four reactors 10a, 10b, 10c, and 10d, respectively.

A predetermined amount of second process gas is distributed and the supply of the second process gas to each of the four reactors 10a, 10b, 10c, and 10d at a flow rate that is controlled on the basis of the control value of a second flow rate starts at the same time.

When an InGaN film and a GaN film are alternately grown on the GaN film of the semiconductor wafer W1, the controller 19 performs control such that four operations, that is, the first process gas supply start operation, the first process gas supply shut off operation, the second process gas supply start operation, and the second process gas supply shut off operation are performed in the four reactors 10a, 10b, 10c, and 10d at the same time.

In addition, the control value of at least one process parameter that is selected from the concentration of the group-III element and the group-V element supplied to the reactors 10a, 10b, 10c, and 10d, the rotation speed of the semiconductor wafer W1, and the temperature of the semiconductor wafer W1 is set for at least one of the four reactors 10a, 10b, 10c, and 10d such that the control value is different from those set for the other reactors and films are grown on the semiconductor wafers W1 in the four reactors 10a, 10b, 10c, and 10d at the same time.

The controller 19 independently sets and controls at least one process parameter among the concentration of the group-III element and the group-V element in the four reactors 10a, 10b, 10c, and 10d, the rotation speed of the semiconductor wafer W1, and the temperature of the semiconductor wafer W1, on the basis of the control values of the concentration of the group-III element and the group-V element in the four reactors 10a, 10b, 10c, and 10d, the rotation speed of the semiconductor wafer W1, and the temperature of the semiconductor wafer W1.

In this embodiment, the control values of the concentration of the group-III element and the group-V element, the rotation speed of the semiconductor wafer W1, and the temperature of the semiconductor wafer W1 which have been determined on the basis of the characteristics of the films grown on the test semiconductor wafer W2 are applied.

For example, when the control value of the concentration of the group-III element and the group-V element is set for a specific reactor such that the control value is different from those set for the other reactors, the control value of the flow rate of the diluent gas which is supplied from the third main gas supply path 31 to the specific reactor is set such that the control value is different from those set for the other reactors.

For example, when the control value of the concentration of the group-III element and the group-V element in the reactor 10a is less than those in the other three reactors 10b, 10c, and 10d, the control value of the flow rate of gas adjusted by the adjustment mass flow meter 134a among the four adjustment mass flow meters 134a, 134b, 134c, and 134d increases. The flow rate of the diluent gas supplied to the fifth sub-gas supply path 33a increases and the control value of the concentration of the group-III element and the group-V element for the reactor 10a is less than those for the other reactors 10b, 10c, and 10d.

For example, when the control value of the concentration of the group-III element and the group-V element for the reactor 10a is greater than those for the other three reactors 10b, 10c, and 10d, the control values of the flow rates of gas adjusted by three adjustment mass flow meter 134b, 134c, 134d among the four adjustment mass flow meters 134a, 134b, 134c, and 134d are greater than the control value of the flow rate of gas adjusted by the adjustment mass flow meter 134a. The flow rate of the diluent gas supplied to the fifth sub-gas supply path 33a decreases and the control value of the concentration of the group-III element and the group-V element for the reactor 10a is greater than those for the other reactors 10b, 10c, and 10d.

For example, when the control value of the rotation speed of the semiconductor wafer W1 for a specific reactor is set to be different from those for the other reactors, the control value of the rotation speed of the rotary driver 114 for the specific reactor is set to be different from those for the other reactors.

For example, when the control value of the temperature of the semiconductor wafer W1 for a specific reactor is set to be different from those for the other reactors, the control value of power supplied to the heater 116 for the specific reactor is set to be different from those for the other reactors.

The first process gas, the second process gas, and the diluent gas are supplied to each of the reactors 10a, 10b, 10c, and 10d by the above-mentioned method and stacked films in which an InGaN film and a GaN film are alternately stacked are formed on a plurality of semiconductor wafers W1 at the same time.

Next, the function and effect of the vapor phase growth apparatus and the vapor phase growth method according to this embodiment will be described.

When films having the same characteristics are grown on a plurality of substrates at the same time, using a plurality of reactors, the process parameters of the reactors are set to the same control values. When the process parameters of the reactors are set to the same control values, it is possible to theoretically grow films having the same characteristics on a plurality of substrates at the same time.

In some cases, even if the process parameters of the reactors are set to the same control values, a variation in the characteristics of the films grown in each reactor occurs. The variation in the characteristics of the film is caused by, for example, the difference between the control value of each process parameter and the actual value.

Among the characteristics of the film to be grown, necessary characteristics are the thickness and composition of the film. When films having the same characteristics are grown on a plurality of substrates at the same time, using a plurality of reactors, it is assumed that the processing time of each reactor is constant. In other words, the process gas supply start time and the process gas supply shut off time are the same in all of the reactors.

Therefore, for example, when there is only the difference in the film thickness between one reactor and the other reactors, it is necessary to change only the thickness of the film in the same processing time, without changing the composition of the film, in order to obtain the same film thickness in the reactors.

When the control value of the flow rate of the process gas supplied to a plurality of reactors is changed for each reactor to independently control the flow rate of the process gas in each reactor, the structure of the vapor phase growth apparatus becomes complicated, which is not preferable. Therefore, it is preferable that the control value of the flow rate of the process gas supplied to each reactor is not independently set. In addition, it is preferable that the control value of the flow rate of the process gas supplied to each reactor is not independently controlled.

Figure 3:
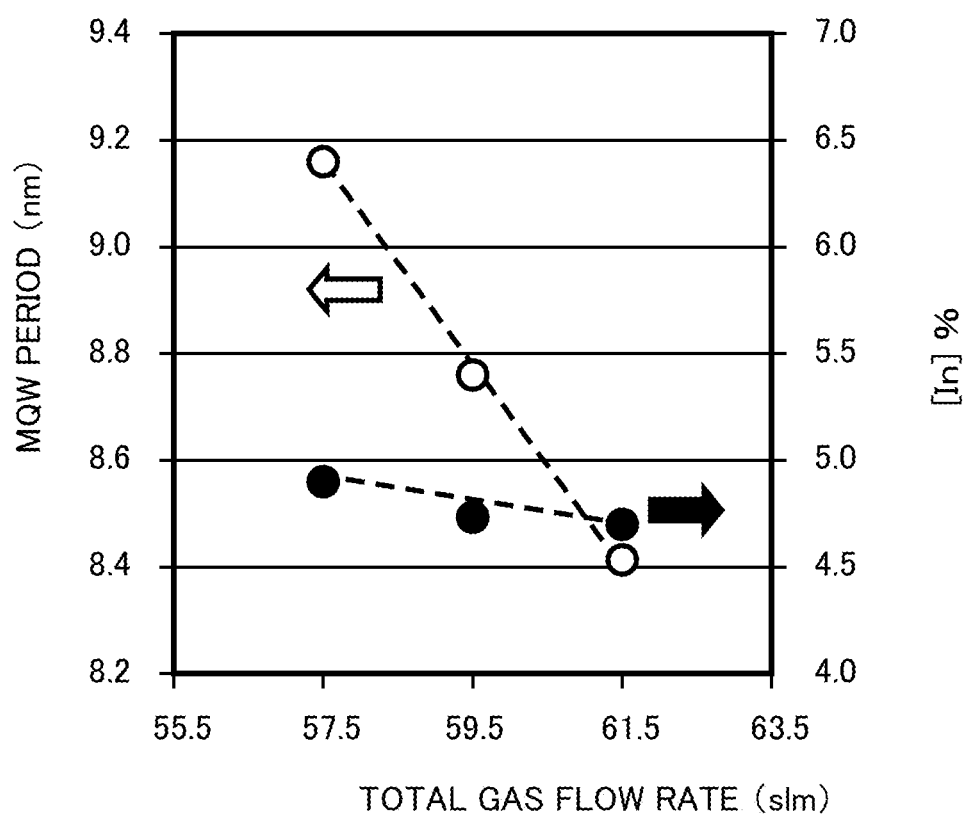
FIG. 3 is a diagram illustrating the function and effect of the first embodiment.

FIG. 3 is a diagram illustrating the function and effect of the vapor phase growth apparatus and the vapor phase growth method according to this embodiment. FIG. 3 is a diagram illustrating the relationship among the total flow rate of the process gas, an MQW period, and the indium composition of films when an InGaN film and a GaN film are alternately grown to form an MQW.

The InGaN film is formed using a mixed gas (first process gas) of TMG and TMI having nitrogen gas as carrier gas and ammonia (second process gas). The GaN film is formed using TMG (first process gas) having nitrogen gas as carrier gas and ammonia (second process gas).

The flow rate of the diluent gas is changed to change the total gas flow rate. Therefore, when the total gas flow rate is high, the concentration of the group-III element and the group-V element which are supplied is low. In contrast, when the total gas flow rate is low, the concentration of the group-III element and the group-V element which are supplied is high.

The MQW period is a total film thickness when one InGaN film and one GaN film are formed.

As can be seen from FIG. 3, the dependence of a change in the MQW period on a change in the total gas flow rate is large and the dependence of a change in the composition of indium in the film on the change in the total gas flow rate is small. When the total gas flow rate is changed, the thickness and composition of the film are changed in different ways. Therefore, for example, the flow rate of the diluent gas can be changed to change only the thickness of the film in the same processing time, without changing the composition of the film.

Figure 4:
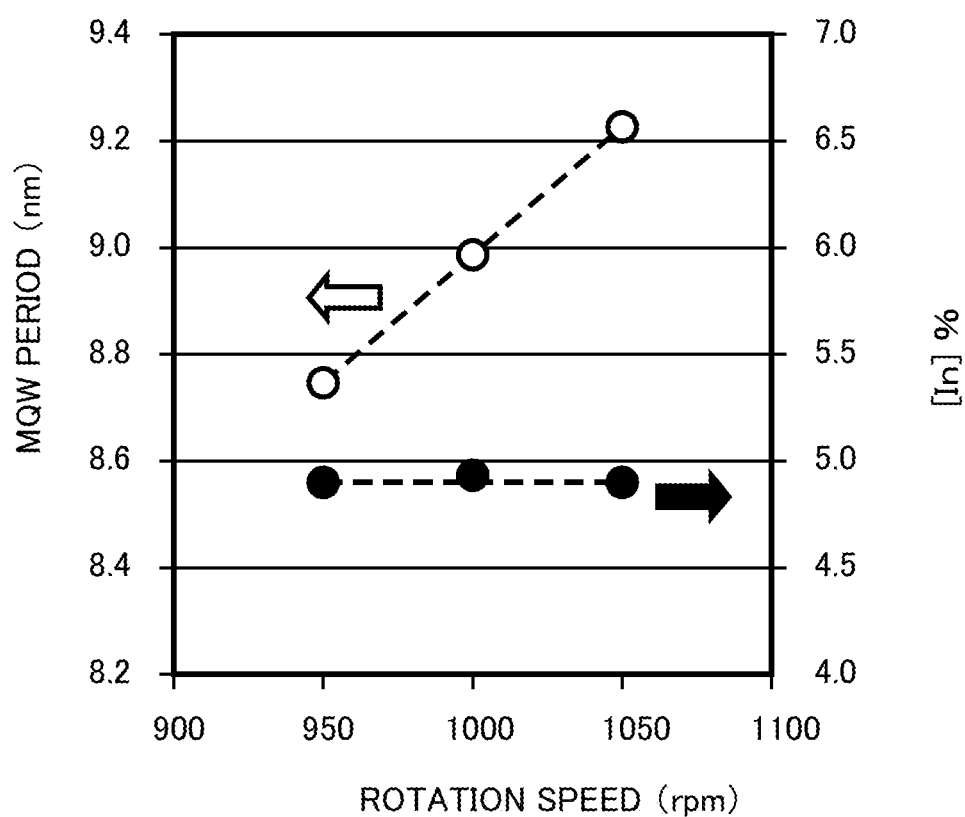
FIG. 4 is a diagram illustrating the function and effect of the first embodiment.

FIG. 4 is a diagram illustrating the function and effect of the vapor phase growth apparatus and the vapor phase growth method according to this embodiment. FIG. 4 is a diagram illustrating the relationship among the rotation speed of the substrate, an MQW period, and the indium composition of films when an InGaN film and a GaN film are alternately grown to form an MQW. In FIG. 4, the process gas used to form the film is the same as that in FIG. 3.

As can be seen from FIG. 4, the dependence of a change in the MQW period on a change in the rotation speed of the substrate is large and the dependence of a change in the indium composition of the film on the change in the rotation speed of the substrate is small. When the rotation speed is changed, the thickness and composition of the film are changed in different ways. Therefore, for example, the rotation speed can be changed to change only the thickness of the film in the same processing time, without changing the composition of the film.

Figure 5:
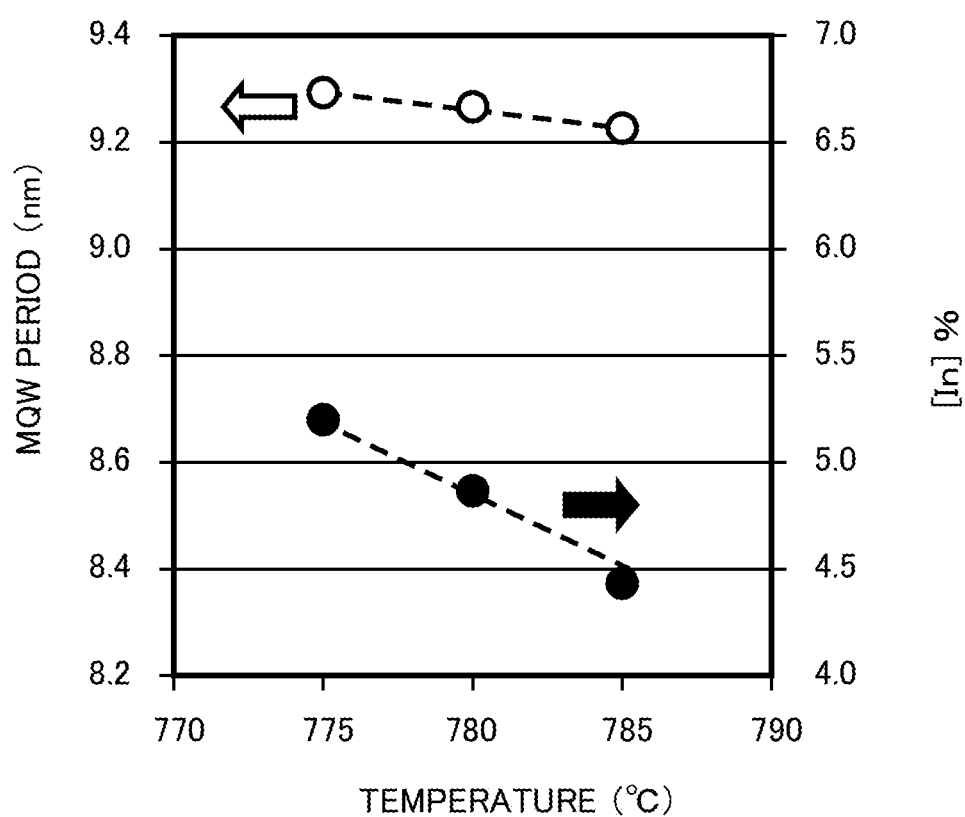
FIG. 5 is a diagram illustrating the function and effect of the first embodiment.

FIG. 5 is a diagram illustrating the function and effect of the vapor phase growth apparatus and the vapor phase growth method according to this embodiment. FIG. 5 is a diagram illustrating the relationship among the temperature of the substrate, an MQW period, and the indium composition of films when an InGaN film and a GaN film are alternately grown to form an MQW. In FIG. 5, the process gas used to form the film is the same as that in FIG. 3.

As can be seen from FIG. 5, the dependence of a change in the MQW period on a change in the temperature of the substrate is small and the dependence of a change in the indium composition of the film on the change in the temperature of the substrate is large. When the temperature of the substrate is changed, the thickness and composition of the film are changed in different ways. Therefore, for example, the temperature of the substrate can be changed to change only the composition of the film in the same processing time, without changing the thickness of the film.

The vapor phase growth apparatus and the vapor phase growth method according to this embodiment perform control such that the control value of at least one process parameter selected from the concentration of the group-III element and the group-V element supplied to the reactors, the rotation speed of the substrate, and the temperature of the substrate is independently set for the n reactors and films are formed on the substrates in the n reactors at the same time. Therefore, when films are formed on a plurality of substrates in a plurality of reactors, the characteristics of the films grown in each reactor can be adjusted so as to be matched with each other.

Second Embodiment

A vapor phase growth apparatus according to this embodiment further includes pressure adjusters which are provided in each of n sub-gas exhaust paths. A controller performs control such that the control value of pressure is independently set for the n reactors and films are grown on substrates in the reactors at the same time. This is the difference between the vapor phase growth apparatus according to this embodiment and the vapor phase growth apparatus according to the first embodiment.

A vapor phase growth method according to this embodiment differs from the vapor phase growth method according to the first embodiment in that the control value of pressure in at least one of the n reactors is set to be different from the control values of pressure in the other reactors and films are grown on substrates in the n reactors at the same time.

The description of the same parts as those in the first embodiment will not be repeated.

Figure 6:
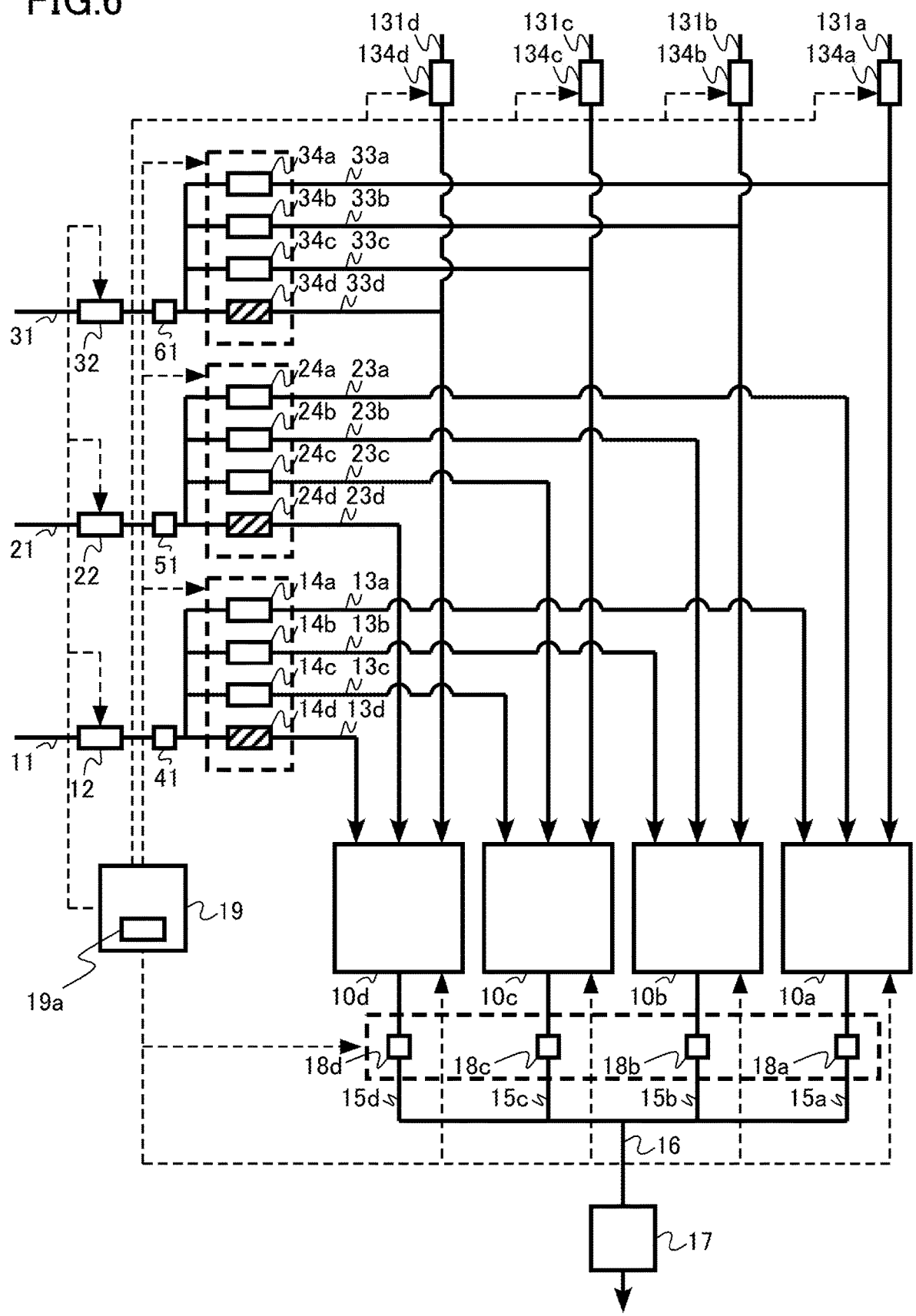
FIG. 6 is a diagram illustrating the structure of a vapor phase growth apparatus according to a second embodiment.

FIG. 6 is a diagram illustrating the structure of the vapor phase growth apparatus according to this embodiment.

The vapor phase growth apparatus according to this embodiment includes four sub-gas exhaust paths 15a, 15b, 15c, and 15d that discharge gas from four reactors 10a, 10b, 10c, and 10d. In addition, the vapor phase growth apparatus includes a main gas exhaust path 16 that is connected to the four sub-gas exhaust paths 15a, 15b, 15c, and 15d. A vacuum pump 17 for drawing gas is provided in the main gas exhaust path 16. The vacuum pump 17 is an example of a pump.

Pressure adjusters 18a, 18b, 18c, and 18d are provided in the four sub-gas exhaust paths 15a, 15b, 15c, and 15d, respectively. The pressure adjusters 18a, 18b, 18c, and 18d adjust the internal pressure of the reactors 10a, 10b, 10c, and 10d to a predetermined value, respectively. The pressure adjusters 18a, 18b, 18c, and 18d are, for example, throttle valves.

A controller 19 performs control such that the control value of pressure in the four reactors 10a, 10b, 10c, and 10d is independently set for the four reactors 10a, 10b, 10c, and 10d and films are grown on substrates in the four reactors 10a, 10b, 10c, and 10d at the same time.

In the vapor phase growth method according to this embodiment, the controller 19 sets the pressure control value of at least one of the pressure adjusters 18a, 18b, 18c, and 18d so as to be different from the pressure control values of the other pressure adjusters. Therefore, the controller 19 performs control such that the control value of pressure in at least one of the four reactors 10a, 10b, 10c, and 10d is different from the control values of pressure in the other reactors. Then, films are grown on substrates in the four reactors 10a, 10b, 10c, and 10d at the same time.

The vapor phase growth apparatus and the vapor phase growth method according to this embodiment can independently control the internal pressure of then reactors at the same time. Therefore, when films are formed on a plurality of substrates in a plurality of reactors at the same time, the characteristics of the films grown in each reactor can be adjusted so as to be matched with each other.

Third Embodiment

A vapor phase growth apparatus according to this embodiment includes a film thickness measure that can measure the thickness of a film that is being grown in a reactor. A controller independently sets at least one of the control values of the concentration of a group-III element and a group-V element supplied to the reactor, the rotation speed of a substrate, and the temperature of the substrate for n reactors, on the basis of the measurement result of the film thickness by the film thickness measure during the growth of the film. This is the difference from the vapor phase growth apparatus according to the first embodiment.

A vapor phase growth method according to this embodiment differs from the vapor phase growth method according to the first embodiment in that at least one of the control values of the concentration of the group-III element and the group-V element supplied to the reactor, the rotation speed of a substrate, and the temperature of the substrate for at least one of the n reactors is changed to a value that is different from those for the other reactors, on the basis of the measurement result of the film thickness by the film thickness measure during the growth of the film, and films are grown on the substrates in the n reactors at the same time.

The description of the same parts as those in the first embodiment will not be repeated.

Figure 7:
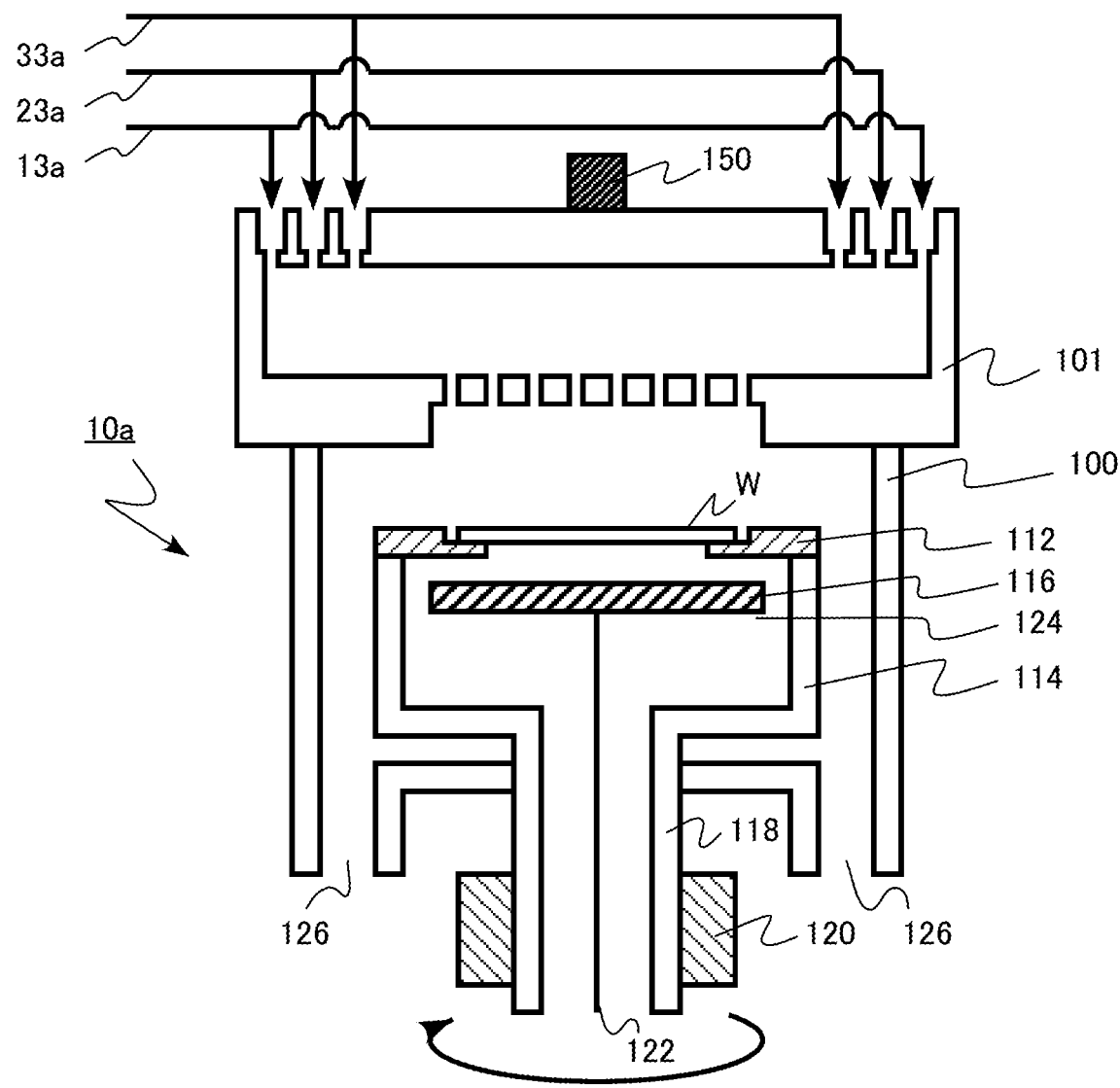
FIG. 7 is a cross-sectional view schematically illustrating a reactor of a vapor phase growth apparatus according to a third embodiment.

FIG. 7 is a diagram schematically illustrating the reactor of the vapor phase growth apparatus according to this embodiment.

The vapor phase growth apparatus according to this embodiment includes a film thickness measure 150 that is provided on a shower plate 101. The film thickness measure 150 can measure the thickness of a film that is being grown on a wafer W. For example, the film thickness measure 150 monitors light interference to measure the thickness of the film that is grown on the substrate.

The controller 19 (FIG. 1) independently sets at least one of the control values of the concentration of the group-III element and the group-V element supplied to four reactors 10a, 10b, 10c, and 10d, the rotation speed of the wafer W, and the temperature of the wafer W for the four reactors 10a, 10b, 10c, and 10d, on the basis of the measurement result of the film thickness by the film thickness measure 150 during the growth of the film.

In the vapor phase growth method according to this embodiment, the controller 19 changes at least one of the control values of the concentration of the group-III element and the group-V element supplied to four reactors 10a, 10b, 10c, and 10d, the rotation speed of the wafer W, and the temperature of the wafer W for at least one of the four reactors 10a, 10b, 10c, and 10d to a value that is different from the control values for the other reactor, on the basis of the measurement result of the film thickness by the film thickness measure 150 during the growth of the film. Then, films are grown on substrates in the four reactors 10a, 10b, 10c, and 10d, on the basis of the changed control value.

The vapor phase growth apparatus and the vapor phase growth method according to this embodiment change the control value of at least one process parameter among the concentration of the group-III element and the group-V element supplied to the reactors, the rotation speed of the wafer W, and the temperature of the wafer W, on the basis of the measurement result of the film thickness by the film thickness measure 150 during the growth of the film. Then, control is performed such that films are grown on substrates in the n reactors at the same time on the basis of the changed control value. Therefore, even if it is determined that there is an error in the thickness of the film which is being grown, a variation in the characteristics of the films between the reactors can be adjusted such that the characteristics of the films are matched with each other.

Fourth Embodiment

A vapor phase growth apparatus according to this embodiment has the same structure as the vapor phase growth apparatus according to the first embodiment, but a vapor phase growth method according to this embodiment differs from the vapor phase growth method according to the first embodiment in that the control value of the power of the heater is reduced to stop a deposition process in at least one of n reactors. The description of the same parts as those in the first embodiment will not be repeated.

In the vapor phase growth method according to this embodiment, similarly to the first embodiment, a deposition process is performed in advance on a semiconductor wafer W1, which is an example of a substrate, in each of four reactors 10a, 10b, 10c, and 10d on the basis of the control value of each process parameter.

When a trouble occurs in the reactor 10a during the deposition process and it is difficult to continuously perform the deposition process, the control value of the power of the heater 116 is reduced to 0 kW to stop the deposition process while the process gas is flowing and the deposition process is continuously performed in the reactors 10b, 10c, and 10d without any trouble, similarly to the first embodiment.

As in the vapor phase growth apparatus according to this embodiment, in a case in which a predetermined amount of process gas is distributed and supplied to the reactors at the same time, when the supply of the process gas to the reactor with a trouble is stopped, various problems arise. Specifically, for example, it is difficult to adjust the flow rate due to the lower limit of the control of the mass flow controller. In addition, a reaction product is accumulated in, for example, an exhaust valve. As a result, gas flows out of the reactor 10a or gas flows backward from the exhaust valve, due to the outflow (internal leakage) of gas from the valve. Therefore, it is necessary to provide a valve on the exhaust side. In addition, it is necessary to change the total flow rate of the process gas and to readjust the control values. Furthermore, since there is a dead space on the upstream pipe side, it is necessary to provide a valve in a branch portion.

However, in this embodiment, even if a trouble occurs in any one of the reactors, the process gas continuously flows to all of the reactors. Therefore, it is possible to prevent the above-mentioned problems.

In this case, even if a trouble occurs in two or more of the reactors, it is possible to continuously perform the deposition process in the other reactors. When the wafer W can be rotated in a reactor with a trouble, the wafer W may be maintained in a rotated state or the rotation of the wafer W may be stopped. When the heater can be turned on, the control value of the power of the heater is not necessarily reduced to 0 kW in order to stop the formation of a film on the wafer W and the wafer W may be heated at a low temperature. That is, the control value of the output of the heater may be set to a value which is less than the control value in the deposition process and at which a process gas reaction does not occur (for example, 0 kW to 5 kW) to stop the formation of a film. Alternatively, the control value of the temperature of the substrate is set to the temperature which is less than the control value in the deposition process and at which a process gas reaction does not occur (for example, a room temperature to 300° C.) to stop the formation of a film.

In this embodiment, control is independently performed for the reactor with a trouble. However, the invention can be applied to a case in which there is an odd lot (for example, when one lot includes 25 wafers and there are four reactors, the remainder is 1). That is, when a new wafer W is processed, the control value of the power of the heater 116 in the reactor in which the deposition process is not performed may be set to 0 kW or a small value or the control value of the temperature of the substrate may be set to a value that is equal to or greater than the room temperature, while the process gas is flowing to all of the reactors. In this case, it is not necessary to readjust the control values of parameters in the lot and to continuously perform a series of deposition processes.

In this case, it is preferable to place a dummy wafer on the support portion 112 in the reactor in which the deposition process is not performed, in order to prevent the process gas from flowing into the rotary driver.

The embodiments of the invention have been described above with reference to examples. The above-described embodiments are illustrative examples and do not limit the invention. In addition, the components according to each embodiment may be appropriately combined with each other.

For example, in the above-described embodiments, examples of the process parameters have been described. However, the process parameters are not necessarily limited to the examples. For example, any process parameters can be used as long as they can be independently controlled in each reactor at a predetermined time when the deposition process is performed in the n reactors. That is, process parameters other than time can be used.

For example, when the remainder of the process gas which does not flow to (n−1) sub-gas supply paths is supplied from one sub-gas supply path to one reactor other than (n−1) reactors, structures other than the embodiments can be used.

For example, in the embodiments, the stacked film in which a plurality of first nitride semiconductor films including indium (In) and gallium (Ga) and a plurality of second nitride semiconductor films including gallium (Ga) are stacked on the GaN film is epitaxial grown. However, for example, the invention can be applied to form other group III-V nitride-based semiconductor single-crystal films, such as aluminum nitride (AlN), aluminum gallium nitride (AlGaN), and indium gallium nitride (InGaN) single-crystal films. In addition, the invention can be applied to a group III-V semiconductor such as GaAs.

In the above-described embodiments, hydrogen gas ($H_2$) is used as the carrier gas. However, nitrogen gas ($N_2$), argon gas (Ar), helium gas (He), or a combination of the gases can be applied as the carrier gas.

In the above-described embodiments, the process gases are mixed in the shower plate. However, the process gases may be mixed before they flow into the shower plate. In addition, the process gases may be in a separated state until they are ejected from the shower plate into the reactor.

In the above-described embodiments, the epitaxial apparatus is the vertical single wafer type in which the deposition process is performed for each wafer in the n reactors. However, the application of the n reactors is not limited to the single-wafer-type epitaxial apparatus. For example, the invention can be applied a horizontal epitaxial apparatus or a planetary CVD apparatus that simultaneously forms films on a plurality of wafers which revolve on their own axes and around the apparatus.

In the above-described embodiments, for example, portions which are not necessary to describe the invention, such as the structure of the apparatus or a manufacturing method, are not described. However, the necessary structure of the apparatus or a necessary manufacturing method can be appropriately selected and used. In addition, all of the vapor phase growth apparatuses and the vapor phase growth methods which include the components according to the invention and whose design can be appropriately changed by those skilled in the art are included in the scope of the invention. The scope of the invention is defined by the scope of the claims and the scope of equivalents thereof.

What is claimed is:

1. A vapor phase growth method comprising:
    loading a plurality of substrates to n reactors, respectively;
    obtaining information of a correlation between characteristics of a thickness of a film and a composition of the film and a process parameter obtained in each of the n reactors;
    calculating control values of the process parameter from the information obtained for each of then reactors, the control values of the process parameter changing one of the characteristics of the thickness of a film and the composition of the film and suppressing to change the other one of the characteristics of the thickness of a film and the composition of the film of each of the n reactors;
    distributing a predetermined amount of first process gas including a group-III element and starting the first process gas supply to the n reactors at the same time at a flow rate controlled on the basis of control values of a first flow rate;
    distributing a predetermined amount of second process gas including a group-V element and starting second process gas supply to the n reactors at the same time at a flow rate controlled on the basis of control values of a second flow rate;
    controlling independently the process parameter of the n reactors. the process parameter selected from: concentration of the group-III element and the group-V element;
    rotation speed of the substrate: temperature of the substrate, on the basis of control values of the process parameter, and growing films on the plurality of substrates in the n reactors at the same time;
    shutting off the first process gas supply to the n reactors at the same time; and
    shutting off the second process gas supply to the n reactors at the same time.

2. The vapor phase growth method according to claim 1, further comprising:
    loading a plurality of test substrates to the n reactors,
    distributing the predetermined amount of the first process gas and starting the first process gas supply to the n reactors at the same time at the flow rate controlled on the basis of the control value of the first flow rate,
    distributing the predetermined amount of second process gas and starting the second process gas supply to the n reactors at the same time at the flow rate controlled on the basis of the control value of the second flow rate,
    controlling the process parameter on the basis of initial control values of the process parameter, and growing films on the plurality of test substrates in then reactors at the same time,
    shutting off the first process gas supply to the n reactors at the same time,
    shutting off the second process gas supply to the n reactors at the same time,
    measuring the one of the, characteristics of the films grown on the plurality of test substrates, and
    calculating the control values of the process parameter of the n reactors on the basis of the measured characteristics of the films.

3. The vapor phase growth method according to claim 1, wherein the film is a stacked film of an indium gallium nitride film and a gallium nitride film.

4. The vapor phase growth method according to claim 3, wherein the process parameter is the rotation speed of the substrate.

5. The vapor phase growth method according to claim 3, wherein the process parameter is the temperature of the substrates.

* * * * *